(12) United States Patent
Lee et al.

(10) Patent No.: US 8,319,421 B2
(45) Date of Patent: Nov. 27, 2012

(54) ORGANIC LIGHT-EMITTING LAMINATE AND ORGANIC ELECTROLUMINESCENT DEVICE CONTAINING THE SAME

(75) Inventors: Meng-Ting Lee, Hsinchu (TW); Jin-Sheng Lin, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 251 days.

(21) Appl. No.: 12/292,306

(22) Filed: Nov. 17, 2008

(65) Prior Publication Data

US 2009/0295278 A1    Dec. 3, 2009

(30) Foreign Application Priority Data

Jun. 2, 2008   (TW) ................... 97120409 A

(51) Int. Cl.
*H01J 1/63*        (2006.01)
(52) U.S. Cl. ...................................... 313/504
(58) Field of Classification Search .............. None
See application file for complete search history.

(56) References Cited

U.S. PATENT DOCUMENTS

| 6,967,062 | B2 | 11/2005 | Hatwar et al. | |
| 7,045,952 | B2 | 5/2006 | Lu | |
| 7,227,027 | B2 | 6/2007 | Qiu et al. | |
| 2005/0074630 | A1 | 4/2005 | Kanno et al. | |
| 2007/0222376 | A1* | 9/2007 | Ohsawa et al. | 313/506 |
| 2008/0284317 | A1* | 11/2008 | Liao et al. | 313/504 |

OTHER PUBLICATIONS

Taiwanese Office Action in corresponding Taiwanese Application No. 097120409, dated Apr. 27, 2012.

* cited by examiner

*Primary Examiner* — Camie Thompson
(74) *Attorney, Agent, or Firm* — Bacon & Thomas, PLLC

(57) ABSTRACT

An organic light-emitting laminate for use in an organic electroluminescent device, characterized in comprising:
  a first light-emitting layer, including a first main light-emitting material and a first phosphorescent material,
  a second light-emitting layer, including a second main light-emitting material and a second phosphorescent material, formed on the first light-emitting layer, and
  a carrier-transporting material, which is included in at least one of the first light-emitting layer and the second light-emitting layer;
  wherein the first main light-emitting material, the second main light-emitting material and the carrier-transporting material each have a triplet energy level higher than that of the first phosphorescent material and the second phosphorescent material.

The present invention also provides an organic electroluminescent device containing the organic light-emitting laminate.

17 Claims, 3 Drawing Sheets

ORGANIC LIGHT-EMITTING LAMINATE AND ORGANIC ELECTROLUMINESCENT DEVICE CONTAINING THE SAME

BACKGROUND OF THE INVENTION

1. Field of the Invention

The present invention is related to an organic light-emitting laminate for use in an organic luminescent device, and an organic electroluminescent device, especially an organic electrophosphorescent device, containing the organic light-emitting laminate.

2. Description of the Prior Art

Recently, with rapid development of electronic products, the conventional CRT (cathode ray tube) displays cannot meet the demand of the market, and the demand for flat panel displays, especially those with lightness, thinness, power saving and high definition, is increasing. Being such circumstances, various organic electroluminescent devices, which have advantages of self light emission, no viewing angle limitation, power saving, easy fabrication and no need for backlight, have been developed.

The organic electroluminescent device emits light by the following mechanism. When an external electric field is applied to an organic semi-conducting film, electrons and holes are injected respectively from a cathode and an anode into the light-emitting layer of the film and are transported across the layer. As the electrons meet the holes in the light-emitting layer, they are recombined to form excitons, which can transfer energy to the light-emitting molecules in the light-emitting layer to make the light-emitting molecules excited. The excited light-emitting molecules will release energy in a form of light when they return to their ground state. Therefore, in brief, the organic electroluminescent device is a device for generating light from electricity.

The organic electroluminescent device generally comprises an anode (such as indium tin oxide (ITO)), a hole-transporting layer vapor-deposited on the anode, an organic light-emitting layer vapor-deposited on the hole-transporting layer, an electron-transporting layer vapor-deposited on the organic light-emitting layer, and a metal layer as cathode formed on the electron-transporting layer.

The color of the light emitted by the organic electroluminescent device depends on the organic fluorescent material(s) contained in the light-emitting layer. In general, in order to elevate the recombination efficiency of carriers and the luminous efficiency of the device, a guest light-emitting material with higher luminous efficiency is doped into the host light-emitting material. One example of the guest light-emitting material is an organic transition metal complex, which can emit phosphorescence due to "the heavy atom effect" of transition metal when it returns to its ground state from its triplet state. An organic electroluminescent device comprising a host light-emitting material and an organic transition metal complex as guest light-emitting material, also called "organic electrophosphorescent device", can utilize all of excitons including those in singlet state and those in triplet state; therefore, its internal quantum efficiency can reach about 100%.

In the organic electrophosphorescent device, the host light-emitting material should have a triplet energy level higher than that of the guest light-emitting material (phosphorescence-emitting material), to avoid energy back transfer to the host light-emitting material (Ref. *Appl. Phys. Lett.*, 83, 569 (2003)). Since singlet energy level is usually higher than triplet energy level for an organic light-emitting material, the host light-emitting materials with high triplet energy level surely has higher singlet energy level, which results in widening of the energy gap between the light-emitting layer and its adjacent layers. Widening of the energy gap may make to the barrier for inject charges into the light-emitting layer; as a result, higher operational voltage may be needed.

In other words, for an organic electroluminescent device that can emit white phosphorescence, if a light-emitting layer comprising a host light-emitting material with a wide energy gap is used, luminous efficiency will be increased, however, operation voltage will be undesirably elevated.

Therefore, it is desired to develop an organic electroluminescent device, especially an organic electrophosphorescent device, which has higher luminous efficiency and lower operational voltage.

SUMMARY OF INVENTION

One object of the present invention is provided an organic light-emitting laminate for use in an organic electroluminescent device.

The organic light-emitting laminate comprises:
a first light-emitting layer, including a first main light-emitting material and a first phosphorescent material,
a second light-emitting layer, including a second main light-emitting material and a second phosphorescent material, formed on the first light-emitting layer, and
a carrier-transporting material, which is included in at least one of the first light-emitting layer and the second light-emitting layer;
wherein the first main light-emitting material, the second main light-emitting material and the carrier-transporting material each have a triplet energy level higher than that of the first phosphorescent material and the second phosphorescent material.

Another object of the present invention is provided an organic electroluminescent device, especially an organic electrophosphorescent device, which has high luminous efficiency at relatively low operational voltage.

The organic electroluminescent device comprises:
an anode layer,
a hole-transporting layer formed on the anode layer,
an organic light-emitting laminate layer formed on the hole-transporting layer,
an electron-transporting layer formed on the organic light-emitting laminate, and
a cathode layer;
wherein the organic light-emitting laminate comprises:
  a first light-emitting layer, including a first main light-emitting material and a first phosphorescent material,
  a second light-emitting layer, including a second main light-emitting material and a second phosphorescent material, formed on the first light-emitting layer, and
  a carrier-transporting material included in at least one of the first light-emitting layer and the second light-emitting layer;
wherein the first main light-emitting material, the second main light-emitting material and the carrier-transporting material each have a triplet energy level higher than that of the first phosphorescent material and the second phosphorescent material.

According to the present invention, a carrier-transporting material is doped into the organic light-emitting laminate to facilitate the injection of carriers; in addition, the main light-emitting materials and the carrier-transporting material each have a triplet energy level higher than that of the phosphorescent materials to avoid energy back transfer. Therefore, the organic electroluminescent device according to the present invention has a reduced operational voltage and an elevated luminous efficiency.

DETAILED DESCRIPTION OF INVENTION

The features of the present invention are further described by the following specific embodiments but are not limited thereto.

Figure 1:
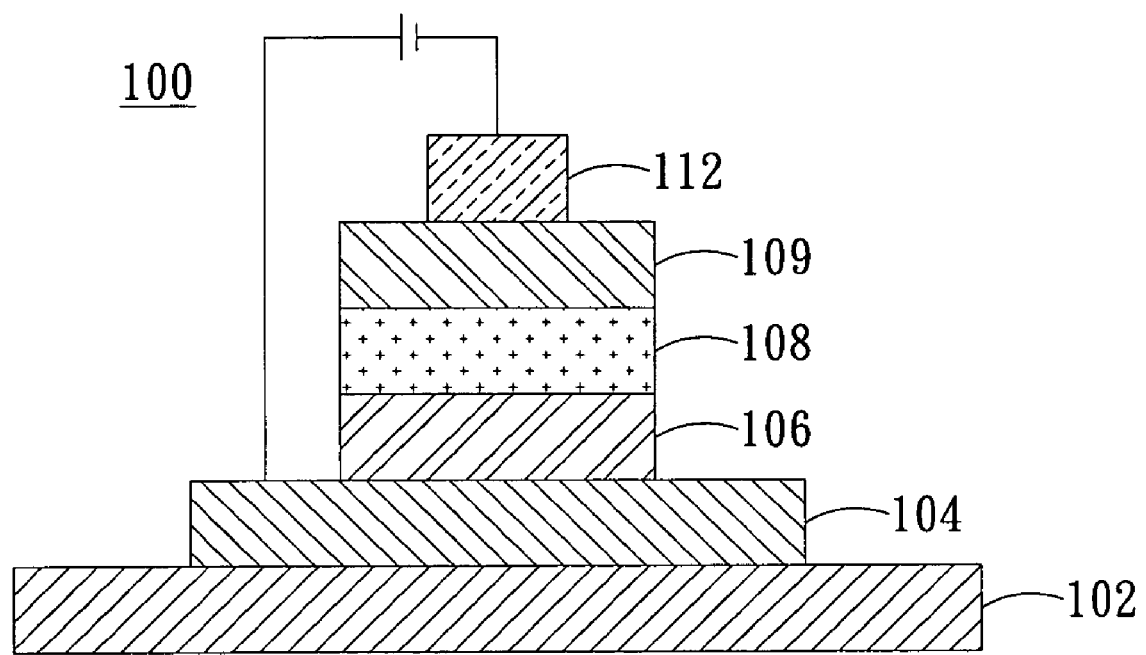
FIG. 1 is a schematic view of the cross section of an organic electroluminescent device according to one embodiment of the present invention.

FIG. 1 is a schematic view of the cross section of an organic electroluminescent device according to one embodiment of the present invention. In this embodiment, the organic electroluminescent device 100 includes a substrate 102, an anode layer 104, a hole-transporting layer 106, an organic light-emitting laminate layer 108, an electron-transporting layer 109 and a cathode layer 112 in the stated order from the bottom to the top. Both the substrate 102 and the anode layer 104 can be made of transparent materials. The examples of the substrate 102 include, but are not limited to, glass or plastic substrate, wherein the plastic substrate is preferred since the organic electroluminescent device made therefrom has better flexibility. The anode layer 104 can be made of, for example, a transparent, conductive metal oxide film, such as an indium tin oxide (ITO) film.

According to the present invention, the hole-transporting layer 106 can be composed of, for example, N,N'-bis-(1-naphthyl)-N,N'-diphenyl-1,1'-biphenyl-4,4'-diamine (NPB).

Figure 2:
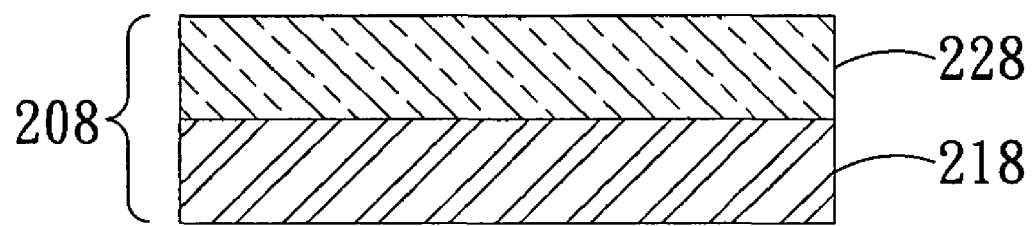
FIG. 2 is a schematic view of the cross section of an organic light-emitting laminate for use in an organic electroluminescent device according to the present invention.

FIG. 2 is a schematic view of the organic light-emitting laminate layer 208 according to the present invention. The organic light-emitting laminate layer includes a first light-emitting layer 218, a second light-emitting layer 228 formed on the first light-emitting layer 218 and a carrier-transporting material (not shown in the figure); wherein the first light-emitting layer 218 includes a first main light-emitting material and a first phosphorescent material; the second light-emitting layer 228 includes a second main light-emitting material and a second phosphorescent material; and the carrier-transporting material is included in at least one of the first light-emitting layer 218 and the second light-emitting layer 228. The main light-emitting material and the carrier-transporting material each have a triplet energy level higher than that of the phosphorescent materials. More specifically, the first and the second main light-emitting material and the carrier-transporting material each have a triplet energy level at least higher than 2.7 eV.

In one embodiment of the organic electroluminescent device according to the present invention, the first light-emitting layer is positioned between the anode layer and the second light-emitting layer; alternatively, the second light-emitting layer is positioned between the anode layer and the first light-emitting layer.

The first main light-emitting material and the second main light-emitting material can be selected from the same or different materials. In one embodiment of the present invention, the first main light-emitting material and the second main light-emitting material are used the same material, for example, a carbazolyl-containing compound. Preferably, the main light-emitting material has a triplet energy level of 2.7 eV or higher. The main light-emitting material according to the present invention can be selected from a group consisting of 9-(4-t-butylphenyl)-3,6-bis(triphenylsilyl)-9H-carbazole of formula (I) (abbreviated as "CzSi"); 2,2'-bis(4-carbazolylphenyl)-1,1'-biphenyl of formula (II) (abbreviated as "4CzPBP"); 4,4'-bis(9-carbazolyl)-2,2'-dimethyl-biphenyl of formula (III) (abbreviated as "CDBP"); N,N'-dicarbazolyl-2,5-benzene of formula (IV) (abbreviated as "mCP"); 3,5-bis(9-carbazolyl)tetraphenylsilane of formula (V) (abbreviated as "SimCP"); and a mixture thereof.

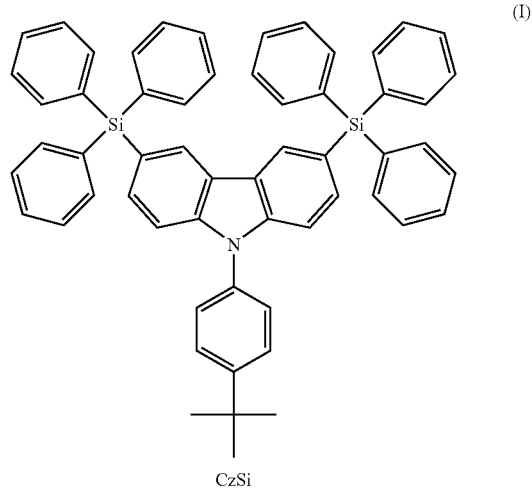

CzSi (I)

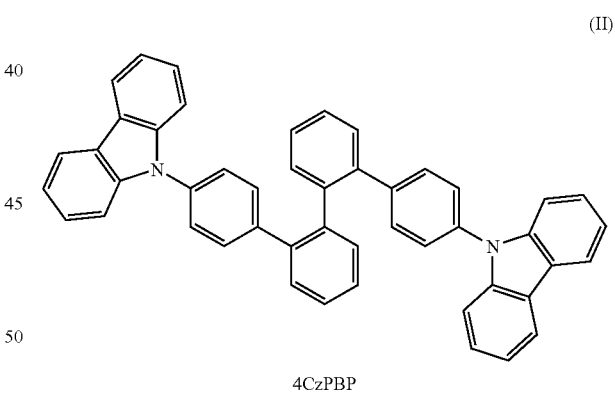

4CzPBP (II)

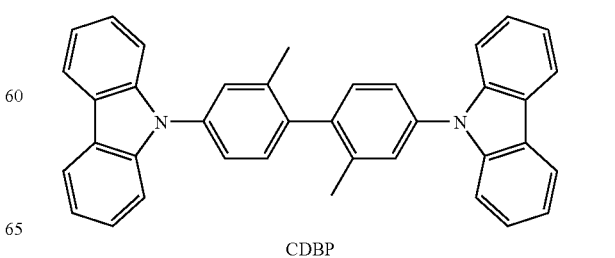

CDBP (III)

-continued

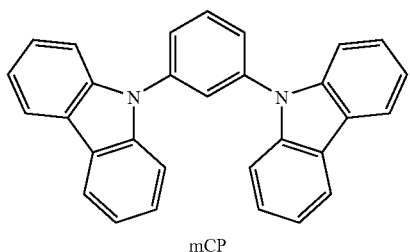

mCP

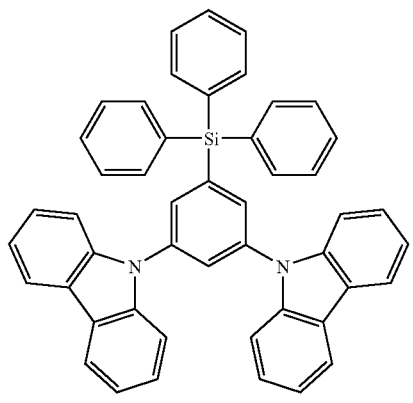

SimCP

The first light-emitting layer according to the present invention can be a yellow light-emitting layer; in such case, the first phosphorescent material can be an organic transition metal complex emitting a light with a wavelength of 550 nm to 630 nm. In one embodiment of the invention, the first phosphorescent material is a compound of formula (VI):

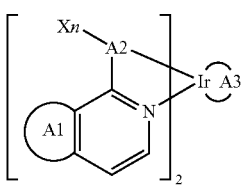

wherein A1 is a substituted or unsubstituted $C_{6-12}$ heteroaromatic ring; A2 is a substituted or unsubstituted $C_{6-12}$ aromatic ring; A3 is acetylacetonate or pyridine-α-carboxylate; X is selected from a group consisting of a fluorine atom, and a trifluoromethyl, alkoxy, alkylthio and amino group; and n is an integer of 0 to 5.

For example, the organic transition metal complex for use as the first phosphorescent material can be selected from a group consisting of

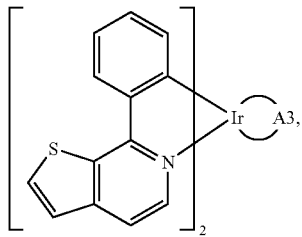

(PO-01)

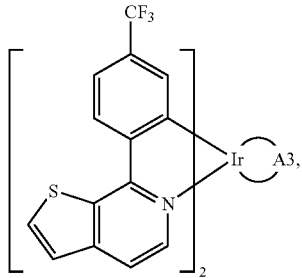

(PO-02)

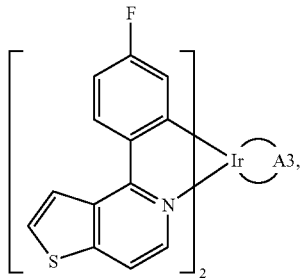

(PO-03)

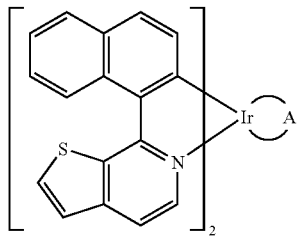

(PO-04)

(wherein A3 is acetylacetonate or pyridine-α-carboxylate), and a mixture thereof.

In one preferred embodiment of the present invention, the organic transition metal complex for use as first phosphorescent material can be selected from a group consisting of bis(2-phenylquinolinato)(acetylacetonato) iridium (III) (abbreviated as "PQIr"), bis-[2-(2'-benzo[4,5-a]thienyl)pyridinato-N,$C^{3'}$]iridium (III)(acetylacetonate) (abbreviated as "Btp2Ir(acac)"), tris[1-phenylisoquinolinato-$C^2$,N]iridium (III) (abbreviated as "Irpiq"), and a mixture thereof.

In one more preferred embodiment of the present invention, the organic transition metal complex for use as first phosphorescent material is PO-01 wherein A3 is acetylacetonate.

The second light-emitting layer according to the present invention can be a blue light-emitting layer; in such case, the second phosphorescent material can be an organic transition metal complex emitting a light with a wavelength of 440 nm to 500 nm. The organic transition metal of such type can be selected from a group consisting of iridium (III)bis[(4,6-difluorophenyl)-pyridinato-N,C2']picolinate of formula (VII) (abbreviated as "FIrpic"), iridium (III)bis(4',6'-difluorophenylpyridinato) tetrakis(1-pyrazolyl)borate of formula (VIII) (abbreviated as "FIr6"), iridium (III) bis(4,6-difluorophenylpyridinato)[3-(trifluoromethyl)-5-(pyridin-2-yl)-1,2,4-triazolate] of formula (IX) (abbreviated as "FIrtaz"), iridium (III)bis(4,6-difluorophenylpyridinato)[5-(pyridin-2-yl)-1H-tetrazolate] of formula (X) (abbreviated as "FIrN4"), and a mixture thereof.

layer or in both. The content of the carrier-transporting material is usually 5 to 20 wt %, preferably 10 to 15 wt %, based on the total weight of the first light-emitting layer and/or the second light-emitting layer.

The carrier-transporting material used in the present invention can be an aromatic compound, preferably a tertiary amino group-containing aromatic compound, for example, one selected from a group consisting of 4,4',4'-tri(N-carbazolyl)triphenylamine of formula (XI) (abbreviated as "TCTA"), bis[4-(p,p'-ditolyl-amino)-phenyl]diphenylsilane of formula (XII) (abbreviated as "DTASi"), 1,1-bis[4-[N,N'-di(p-tolyl)amino]phenyl]cyclohexane of formula (XIII) (abbreviated as "TAPC"), tris[4-(9-phenyl-fluoren-9-yl)phenyl] amine of formula (XIV) (abbreviated as "TFTPA"), and a mixture thereof.

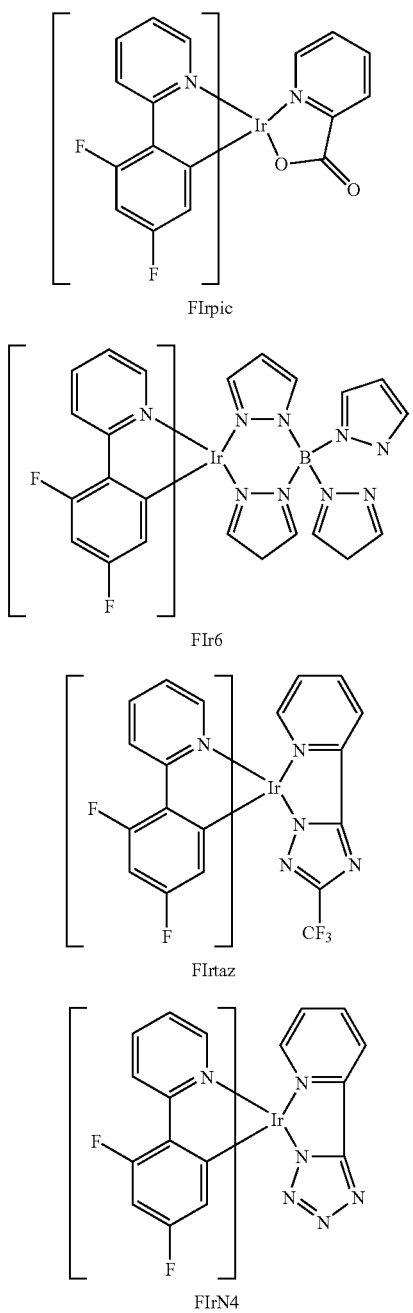

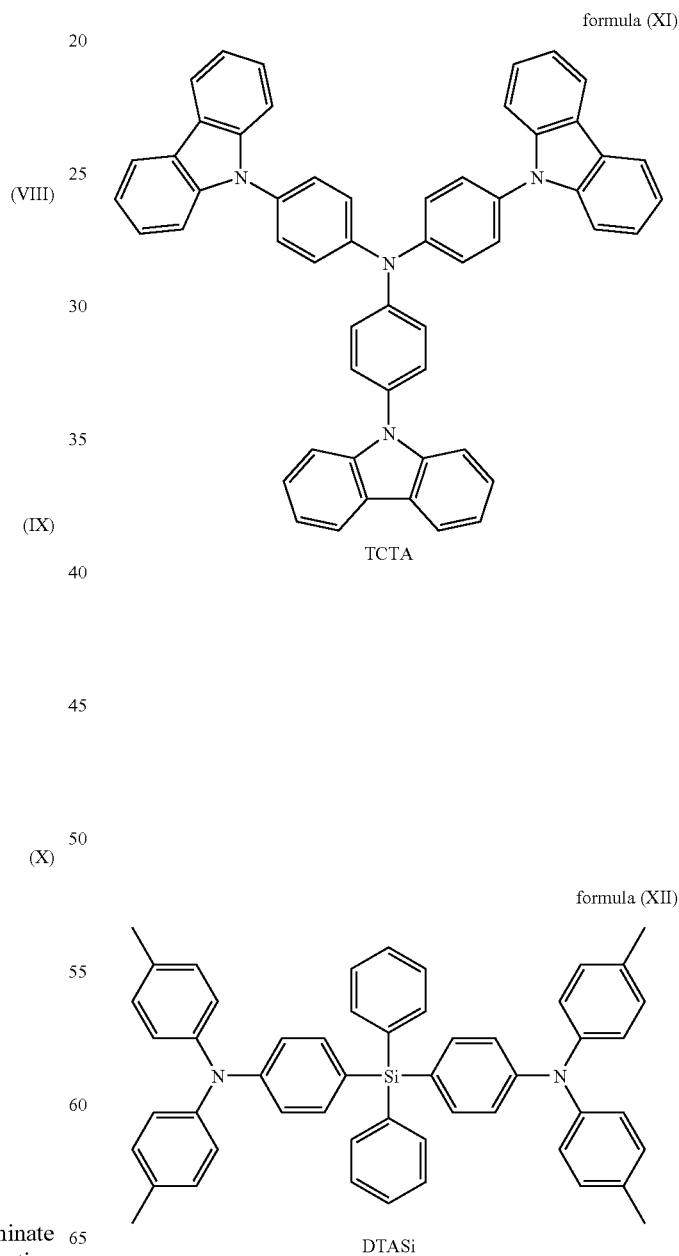

In one embodiment of the organic light-emitting laminate according to the present invention, the carrier-transporting material is included in the first or the second light-emitting -continued

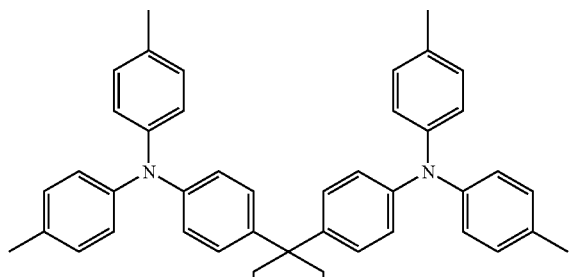

TAPC formula (XIII)

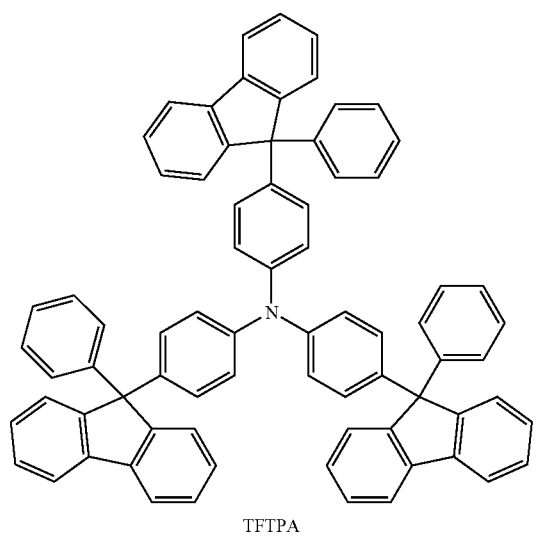

TFTPA formula (XIV)

The triplet energy levels of the first and the second main light-emitting materials and the triplet energy level of the carrier-transporting material must be respectively higher than that of the phosphorescent materials; wherein the triplet energy levels of the first and the second main light-emitting materials are preferably higher than 2.7 eV. Table 1 shows the triplet energy levels of the main light-emitting materials, the carrier-transporting material and the phosphorescent materials in one embodiment of the organic light-emitting laminate according to the present invention.

TABLE 1

The triplet energy levels of the main light-emitting materials, the carrier-transporting material and the phosphorescent materials

| | material | | | | | |
|---|---|---|---|---|---|---|
| | main light-emitting material | | phosphorescent material | | carrier-transporting material | |
| Ev | CzSi | 4CzPBP | FIrpic | PO-01 | TCTA | DTASi |
| Triplet energy level | 3.0 | 2.77 | 2.62 | 2.1 | 2.85 | 2.95 |

Ev: energy level

In case that a carrier-transporting material is doped into the blue light-emitting layer, the doped carrier-transporting material should also have a triple energy level higher than that of the blue phosphorescent material in said layer, so as to avoid transfer of the energy produced by the blue light-emitting layer to the doped carrier-transporting material.

When an electric voltage is applied to an organic electroluminescent device, electrons and holes are transported respectively through the electron-transporting layer 109 and the hole-transporting layer 106 to the organic light-emitting layer 108 (see FIG. 1); thereafter, electrons and holes are recombined in the organic light-emitting layer 108, and make the organic light-emitting layer 108 emit light. As the main light-emitting material and the carrier-transporting material each have a triple energy level higher than that of the phosphorescent material, and the absolute value of the difference in HOMO energy level between the main light-emitting material and the carrier-transporting material is 0.34 eV or lower, operation voltage can be reduced, in the meanwhile, luminous efficiency can be elevated.

Figure 3:
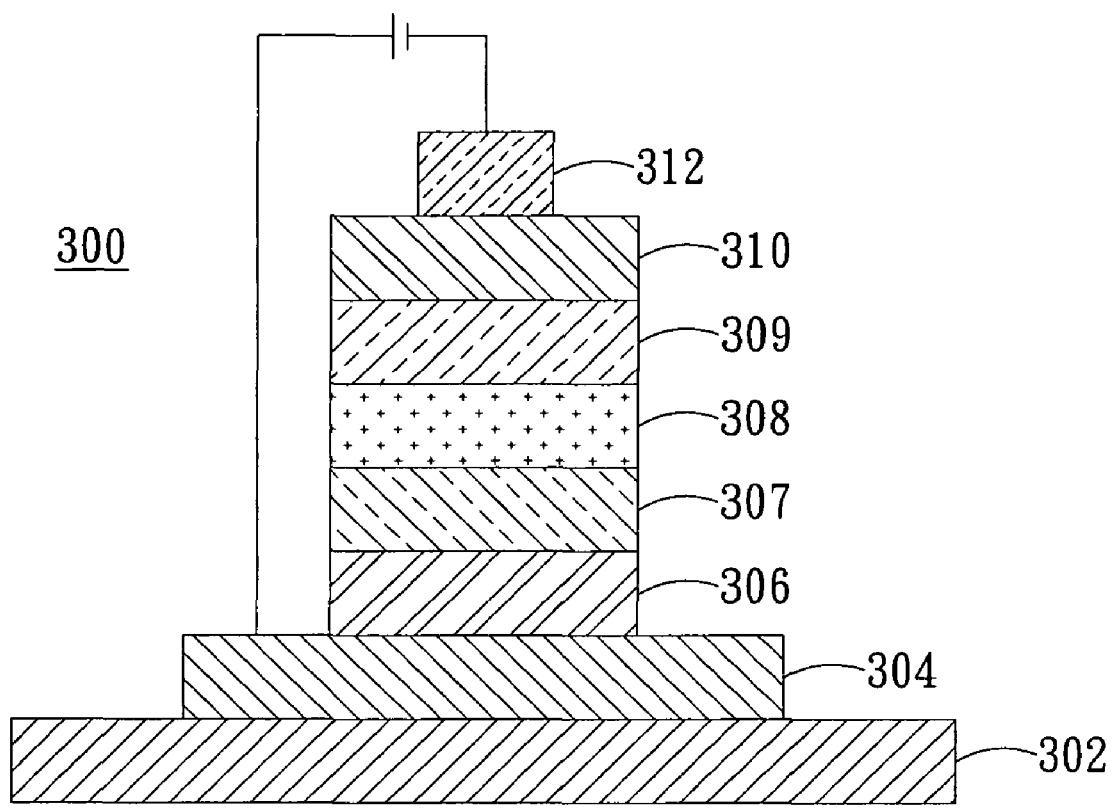
FIG. 3 is a schematic view of the cross section of an organic electroluminescent device according to another embodiment of the present invention.

Next, reference is made to FIG. 3. The organic electroluminescent device 300 may further comprise an electron blocking layer 307 and an electron-injecting layer 310. The blocking layer 307 is positioned between the hole-transporting layer 306 and the organic light-emitting laminate layer 308 to prevent the electrons that have been transported to the organic light-emitting laminate layer 308 from being transported away therefrom. The electron-injecting layer 310 is positioned between the cathode layer 312 and the electron-transporting layer 309 to facilitate injection of the electrons into the organic light-emitting layer 308. Based on the above, the electrons and the holes in the organic light-emitting layer can have a prolonged retention time, thus the luminous efficiency can be further elevated.

The organic electroluminescent device according to the present invention is further illustrated by the following Examples, but the materials and their ratios used in the individual layers as well as the layer thickness are not limited to those exemplified.

In the following Examples, the main light-emitting material, the phosphorescent material and the carrier-transporting material as well as their ratios were varied; in addition, operational voltage, current efficiency and luminous efficiency for each device were measured.

Example 1

In the organic light-emitting laminate layer of this Example, CzSi was used as first and second main light-emitting materials; PO-01 and FIrpic were respectively used as first and second phosphorescent materials; and TCTA was used as carrier-transporting material.

A 150 nm thick layer of ITO (indium tin oxide) as anode layer was formed on a 0.7 nm thick glass substrate, then a 45 nm thick layer of NPB as hole-transporting layer was deposited on the anode layer and a 15 nm thick layer of DTASi as electron-blocking layer was deposited on the hole-transporting layer, both deposited by thermal vaporization. Next, CzSi as first main light-emitting material and PO-01 as first phosphorescent material, in a weight ratio of 92:8, were co-deposited by vaporization on the electron-blocking layer to form a first light-emitting layer with a thickness of 10 nm, which emits yellow light. Next, CzSi as second main light-emitting material, FIrpic as second phosphorescent material and TCTA as carrier-transporting material, in a weight ratio of 80:10:10, were co-deposited by vaporization on the first light-emitting layer to form a second light-emitting layer with a thickness of 10 nm, which emits blue light. Thereafter, a 25 nm thick layer of 4,7-diphenyl-1,10-phenanthroline (Bphen) was deposited by thermal vaporization on the second light-emitting layer to act as electron-transporting layer; then Cs$_2$CO$_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

The electrical and optical properties of the organic electroluminescent device thus obtained were measured at a brightness of 1000 cd/m$^2$ and the results were listed in Table 2.

Example 2

In the organic light-emitting laminate layer of this Example, CzSi was used as first and second main light-emitting materials; PO-01 and FIrpic were respectively used as first and second phosphorescent materials; and DTASi was used as carrier-transporting material.

A 150 nm thick layer of ITO (indium tin oxide) as anode layer was formed on a 0.7 nm thick glass substrate, then a 45 nm thick layer of NPB as hole-transporting layer was formed on the anode layer and a 15 nm thick layer of DTASi as electron-blocking layer was formed on the hole-transporting layer, both deposited by thermal vaporization. Next, CzSi as first main light-emitting material and PO-01 as first phosphorescent material, in a weight ratio of 92:8, were co-deposited by vaporization on the electron-blocking layer to form a first light-emitting layer with a thickness of 10 nm, which emits yellow light. Next, CzSi as second main light-emitting material, FIrpic as second phosphorescent material and DTASi as carrier-transporting material, in a weight ratio of 80:10:10, were co-deposited by vaporization on the first light-emitting layer to form a second light-emitting layer with a thickness of 10 nm, which emits blue light. Thereafter, a 25 nm thick layer of Bphen was deposited by thermal vaporization on the second light-emitting layer to act as electron-transporting layer; then Cs$_2$CO$_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

The electrical and optical properties of the organic electroluminescent device thus obtained were measured at a brightness of 1000 cd/m$^2$ and the results were listed in Table 2.

Example 3

In the organic light-emitting laminate layer of this Example, 4CzPBP was used as first and second main light-emitting materials; PO-01 and FIrpic were respectively used as first and second phosphorescent materials; and TCTA was used as carrier-transporting material.

A 150 nm thick layer of ITO (indium tin oxide) as anode layer was formed on a 0.7 nm thick glass substrate, then a 45 nm thick layer of NPB as hole-transporting layer was formed on the anode layer and a 15 nm thick layer of DTASi as electron-blocking layer was formed on the hole-transporting layer, both deposited by thermal vaporization. Next, 4CzPBP as first main light-emitting material and PO-01 as first phosphorescent material, in a weight ratio of 85:15, were co-deposited by vaporization on the electron-blocking layer to form a first light-emitting layer with a thickness of 12 nm, which emits yellow light. Next, 4CzPBP as second main light-emitting material, FIrpic as second phosphorescent material and TCTA as carrier-transporting material, in a weight ratio of 70:15:15, were co-deposited by vaporization on the first light-emitting layer to form a second light-emitting layer with a thickness of 8 nm, which emits blue light. Thereafter, a 25 nm thick layer of Bphen was deposited by thermal vaporization on the second light-emitting layer to act as electron-transporting layer; then Cs$_2$CO$_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

The electrical and optical properties of the organic electroluminescent device thus obtained were measured at a brightness of 1000 cd/m$^2$ and the results were listed in Table 2.

Comparative Example 1

Except the second light-emitting layer did not contain any carrier-transporting material, the procedures are similar to those stated in Examples 1 to 3. The electrical and optical properties of the comparative organic electroluminescent devices were also measured at a brightness of 1000 cd/m$^2$ and the results were listed in Table 2.

Comparative Example 1-1

A 150 nm thick layer of ITO as anode layer was formed on a 0.7 nm thick glass substrate, then a 45 nm thick layer of NPB as hole-transporting layer was formed on the anode layer and a 15 nm thick layer of DTASi as electron-blocking layer was formed on the hole-transporting layer, both deposited by thermal vaporization. Next, CzSi as first main light-emitting material and PO-01 as first phosphorescent material, in a weight ratio of 92:8, were co-deposited by vaporization on the electron-blocking layer to form a first light-emitting layer with a thickness of 4 nm, which emits yellow light. Next, CzSi as second main light-emitting material and FIrpic as second phosphorescent material, in a weight ratio of 90:10, were co-deposited by vaporization on the first light-emitting layer to form a second light-emitting layer with a thickness of 16 nm, which emits blue light. Thereafter, a 25 nm thick layer of Bphen was deposited by thermal vaporization on the second light-emitting layer to act as electron-transporting layer; then Cs$_2$CO$_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

Comparative Example 1-2

A 150 nm thick layer of ITO as anode layer was formed on a 0.7 nm thick glass substrate, then a 45 nm thick layer of NPB as hole-transporting layer was formed on the anode layer and a 15 nm thick layer of DTASi as electron-blocking layer was formed on the hole-transporting layer, both by thermal vaporization. Next, 4CzPBP as first main light-emitting material and PO-01 as first phosphorescent material, in a weight ratio of 85:15, were co-deposited by vaporization on the electron-blocking layer to form a first light-emitting layer with a thickness of 4 nm, which emits yellow light. Next, 4CzPBP as second main light-emitting material and FIrpic as second phosphorescent material, in a weight ratio of 85:15, were co-deposited by vaporization on the first light-emitting layer to form a second light-emitting layer with a thickness of 16 nm, which emits blue light. Thereafter, a 25 nm thick layer of Bphen was deposited by thermal vaporization on the second light-emitting layer to act as electron-transporting layer; then $Cs_2CO_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

Comparative Example 2

Except a carrier-transporting material, which has a triplet energy level lower than the triplet energy level of the phosphorescent material used in the second light-emitting layer, was used, the procedures are similar to those stated in Examples 1 to 3. The electrical and optical properties of the comparative organic electroluminescent devices were also measured at a brightness of 1000 cd/m² and the results were listed in Table 2.

In the organic light-emitting laminate layer of Comparative Example 2, CzSi was used as first and second main light-emitting materials; PO-01 and FIrpic were respectively used as first and second phosphorescent materials; and NPB with a triple energy level of 2.3 eV was used as carrier-transporting material. The manufacturing procedures are stated below.

A 150 nm thick layer of ITO (indium tin oxide) as anode layer was formed on a 0.7 nm thick glass substrate, then a 45 nm thick layer of NPB as hole-transporting layer was formed on the anode layer and a 15 nm thick layer of DTASi as electron-blocking layer was formed on the hole-transporting layer, both deposited by thermal vaporization. Next, CzSi as first main light-emitting material and PO-01 as first phosphorescent material, in a weight ratio of 92:8, were co-deposited by vaporization on the electron-blocking layer to form a first light-emitting layer with a thickness of 10 nm, which emits yellow light. Next, CzSi as second main light-emitting material, FIrpic as second phosphorescent material and NPB as carrier-transporting material, in a weight ratio of 80:10:10, were co-deposited by vaporization on the first light-emitting layer to form a second light-emitting layer with a thickness of 10 nm, which emits blue light. Thereafter, a 25 nm thick layer of 4,7-diphenyl-1,10-phenanthroline (Bphen) was deposited by thermal vaporization on the second light-emitting layer to act as electron-transporting layer; then $Cs_2CO_3$ and Bphen, in a weight ratio of 20:80 were co-deposited by vaporization on the electron-transporting layer to form an electron-injecting layer with a thickness of 20 nm. Finally, a 100 nm thick layer of Al as cathode layer was deposited by thermal vaporization on the electron-injecting layer.

TABLE 2

Electrical and Optical Properties of the Organic Electroluminescent Device of Examples and Comparative Examples

| | 1st Light-emitting layer | | 2nd Light-emitting layer | | | Properties measured at 1000 cd/m² | | |
|---|---|---|---|---|---|---|---|---|
| | Main[1] | Phos[2] | Main[2] | Phos[2] | Carrier[3] | Operational Voltage (V) | Current Efficiency (cd/A) | Color Coordinate (CIEx, y) |
| Example 1 | CzSi | PO-01 8% | CzSi | FIrpic 10% | TCTA 10% | 4.4 | 24.9 | (0.34, 0.42) |
| Example 2 | CzSi | PO-01 8% | CzSi | FIrpic 10% | DTASi 10% | 4.6 | 22.6 | (0.34, 0.42) |
| Example 3 | 4CzPBP | PO-01 15% | 4CzPBP | FIrpic 10% | TCTA 15% | 4.4 | 28.4 | (0.38, 0.43) |
| Comp. Example 1-1 | CzSi | PO-01 8% | CzSi | FIrpic 10% | — | 4.8 | 17.5 | (0.35, 0.43) |
| Comp. Example 1-2 | 4CzPBP | PO-01 15% | 4CzPBP | FIrpic 10% | — | 4.8 | 20.4 | (0.40, 0.43) |
| Comp. Example 2 | CzSi | PO-01 8% | CzSi | FIrpic 10% | NPB 10% | 5.2 | 9.6 | (0.44, 0.43) |

As shown in Table 2, Comparative Example 1-1 used the same main light-emitting material and the same phosphorescent as Examples 1 and 2 but did not use any carrier transporting material. As a result, injection of electric charges into the light-emitting layer became less efficient and a higher operational voltage was needed. In addition, the recombination probability of electrons and holes were decreased due to absence of the carrier-transporting material in Comparative Example 1-1; therefore, the current efficiency was as low as 17.5 cd/A, which was significantly lower that that of the devices of Examples 1 and 2. Similarly, the operational voltage and the current efficiency of the device of Comparative Example 1-2, wherein no carrier-transporting material was used, were lower than those of the device of Example 3.

These results reveals that in case the first and the second main light-emitting materials are the same, the luminous efficiency measured at a brightness of 1000 cd/m² can be elevated by 30~42% when a carrier-transporting material according to the present invention is doped into the second light-emitting layer, namely, the blue light-emitting layer.

Furthermore, in Comparative Example 2, NPB with a triplet energy level of 2.3 eV, which is possessed a lower triplet energy level than that of the second phosphorescent material (2.62 eV), was used as carrier-transporting material. As a result, much higher operational voltage (5.2 V) was needed when compared with that of the device according to the present invention (4.4~4.6 V). In addition, the current efficiency of the device of Comparative Example 2 was as low as 9.6 cd/A, as shown in Table 2.

In conclusion, the first main light-emitting material, the second main light-emitting material and the carrier-transporting material each should have a triplet energy level higher than that of the first phosphorescent material and the second phosphorescent material. For example, the first main light-emitting material, the second main light-emitting material and the carrier-transporting material each preferably have a triplet energy level higher than 2.7 eV; thereby, the organic electroluminescent device according to the present invention can has an elevated luminous efficiency and a reduced operation voltage.

The above Examples merely illustrate the present invention although the present invention is not limited thereto. Slight modification and alteration can be made on the structures, shapes and features of the exemplified devices without departing the spirit of the present invention. The scope of the present invention is defined by the appended claims.

What is claimed is:

1. An organic light-emitting laminate for use in an organic electroluminescent device, characterized in comprising:
   a first light-emitting layer, including a first main light-emitting material and a first phosphorescent material,
   a second light-emitting layer, including a second main light-emitting material and a second phosphorescent material, formed on the first light-emitting layer, and
   a carrier-transporting material, which is doped in both of the first light-emitting layer and the second light-emitting layer;
   wherein the first main light-emitting material, the second main light-emitting material and the carrier-transporting material each have a triplet energy level higher than that of the first phosphorescent material and the second phosphorescent material;
   wherein the second phosphorescent material is different from the first phosphorescent material;
   wherein the carrier-transporting material is not used as the first main light-emitting material and the second main light-emitting material; and
   wherein the first phosphorescent material is selected from a group consisting of

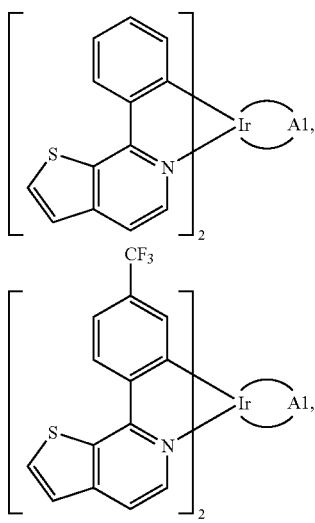

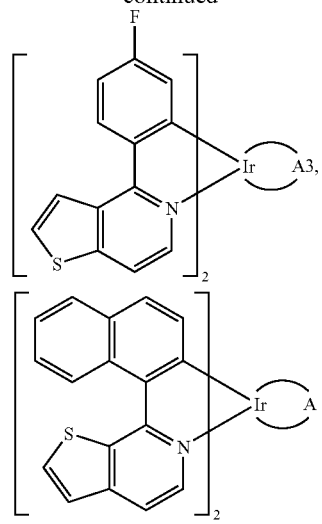

or a mixture thereof, and
wherein A3 is acetylacetonate or pyridine-α-carboxylate.

2. The organic light-emitting laminate according to claim 1, wherein the first main light-emitting material and the second main light-emitting material are the same.

3. The organic light-emitting laminate according to claim 2, wherein the first main light-emitting material and the second main light-emitting material are carbazolyl-containing compounds.

4. The organic light-emitting laminate according to claim 3, wherein the first main light-emitting material and the second main light-emitting material are selected from a group consisting of
   9-(4-t-butylphenyl)-3,6-bis(triphenylsilyl)-9H-carbazole (CzSi);
   2,2'-bis(4-carbazolylphenyl)-1,1'-biphenyl (4CzPBP);
   4,4'-bis(9-carbazolyl)-2,2'-dimethyl-biphenyl (CDBP);
   N,N'-dicarbazolyl-2,5-benzene (mCP);
   3,5-bis(9-carbazolyl)tetraphenylsilane (SimCP); and
   a mixture thereof.

5. The organic light-emitting laminate according to claim 1, wherein the first main light-emitting material, the second main light-emitting material and the carrier-transporting material each have a triplet energy level higher than 2.7 eV.

6. The organic light-emitting laminate according to claim 1, wherein the second phosphorescent material is an organic transition metal complex emitting a light with a wavelength of 440 nm to 500 nm.

7. The organic light-emitting laminate according to claim 6, wherein the organic transition metal complex is selected from a group consisting of
   iridium(III)bis[(4,6-difluorophenyl)-pyridinato-N,C$^{2'}$]picolinate (FIrpic),
   iridium(III)bis(4',6'-difluorophenylpyridinato)tetrakis(1-pyrazolyl) borate (FIr6),
   iridium(III)bis(4,6-difluorophenylpyridinato)[3-(trifluoromethyl)-5-(pyridin-2-yl)-1,2,4-triazolate] (FIrtaz),
   iridium(III)bis(4,6-difluorophenylpyridinato)[5-(pyridin-2-yl)-1H-tetrazolate] (FIrN4), and
   a mixture thereof.

8. The organic electroluminescent device according to claim 7, wherein the carrier-transporting material is a tertiary amino group-containing aromatic compound; the carrier-transporting material is selected from a group consisting of
4,4',4'-tri(N-carbazolyl)triphenylamine (TCTA),
bis[4-(p,p'-ditolylamino)-phenyl]diphenylsilane (DTASi),
1,1-bis[4-[N,N'-di(p-tolyl)amino]phenyl]cyclohexane (TAPC),
tris[4-(9-phenylfluoren-9-yl)phenyl]amine (TFTPA), and
a mixture thereof.

9. The organic electroluminescent device according to claim 7, wherein the content of the carrier-transporting material is 5 to 20 wt % based on the total weight of the first light-emitting layer and/or the second light-emitting layer.

10. The organic light-emitting laminate according to claim 1, wherein the carrier-transporting material is a tertiary amino group-containing aromatic compound.

11. The organic light-emitting laminate according to claim 10, wherein the carrier-transporting material is selected from a group consisting of
4,4',4'-tri(N-carbazolyl)triphenylamine (TCTA),
bis[4-(p,p'-ditolylamino)-phenyl]diphenylsilane (DTASi),
1,1-bis[4-[N,N'-di(p-tolyl)amino]phenyl]cyclohexane (TAPC),
tris[4-(9-phenylfluoren-9-yl)phenyl]amine (TFTPA), and
a mixture thereof.

12. The organic light-emitting laminate according to claim 1, wherein the content of the carrier-transporting material is 5 to 20 wt % based on the total weight of the first light-emitting layer and/or the second light-emitting layer.

13. An organic electroluminescent device, comprising:
an anode layer,
a hole-transporting layer formed on the anode layer,
an organic light-emitting laminate layer formed on the hole-transporting layer,
an electron-transporting layer formed on the organic light-emitting laminate, and
a cathode layer;
wherein the organic light-emitting laminate comprises:
a first light-emitting layer, including a first main light-emitting material and a first phosphorescent material,
a second light-emitting layer, including a second main light-emitting material and a second phosphorescent material, formed on the first light-emitting layer, and
a carrier-transporting material, which is doped in both of the first light-emitting layer and the second light-emitting layer;
wherein the first main light-emitting material, the second main light-emitting material and the carrier-transporting material each have a triplet energy level higher than that of the first phosphorescent material and the second phosphorescent material;
wherein the second phosphorescent material is different from the first phosphorescent material;
wherein the carrier-transporting material is not used as the first main light-emitting material and the second main light-emitting material; and
wherein the first phosphorescent material is selected from a group consisting of

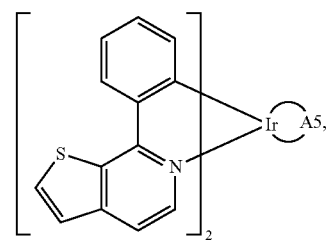

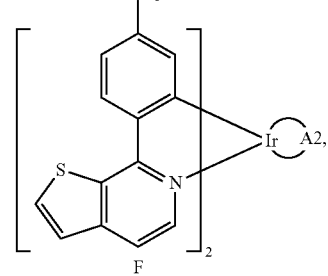

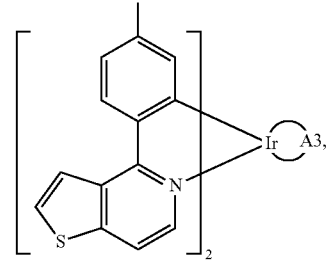

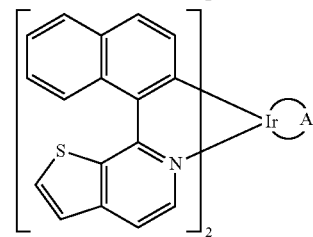

or a mixture thereof, and
wherein A3 is acetylacetonate or pyridine-α-carboxylate.

14. The organic electroluminescent device according to claim 13, wherein the first main light-emitting material and the second main light-emitting material are the same.

15. The organic electroluminescent device according to claim 14, wherein the first main light-emitting material and the second main light-emitting material are carbazolyl-containing compounds; the first main light-emitting material and the second main light-emitting material are selected from a group consisting of
9-(4-t-butylphenyl)-3,6-bis(triphenylsilyl)-9H-carbazole (CzSi);
2,2'-bis(4-carbazolylphenyl)-1,1'-biphenyl (4CzPBP);
4,4'-bis(9-carbazolyl)-2,2'-dimethyl-biphenyl (CDBP);
N,N'-dicarbazolyl-2,5-benzene (mCP);
3,5-bis(9-carbazolyl)tetraphenylsilane (SimCP); and
a mixture thereof.

16. The organic electroluminescent device according to claim 13, wherein the first main light-emitting material, the second main light-emitting material and the carrier-transporting material each have a triplet energy level higher than 2.7 eV.

17. The organic electroluminescent device according to claim 7, wherein the second phosphorescent material is an organic transition metal complex emitting a light with a wavelength of 440 nm to 500 nm; the organic transition metal complex is selected from a group consisting of
- iridium(III)bis[(4,6-difluorophenyl)-pyridinato-N,$C^{2'}$]picolinate (FIrpic),
- iridium(III)bis(4',6'-difluorophenylpyridinato)tetrakis(1-pyrazolyl) borate (FIr6),
- iridium(III)bis(4,6-difluorophenylpyridinato)[3-(trifluoromethyl)-5-(pyridin-2-yl)-1,2,4-triazolate] (FIrtaz),
- iridium(III)bis(4,6-difluorophenylpyridinato)[5-(pyridin-2-yl)-1H-tetrazolate] (FIrN4), and
- a mixture thereof.

* * * * *